(12) United States Patent
Haimson et al.

(10) Patent No.: US 7,803,715 B1
(45) Date of Patent: Sep. 28, 2010

(54) LITHOGRAPHIC PATTERNING FOR SUB-90NM WITH A MULTI-LAYERED CARBON-BASED HARDMASK

(76) Inventors: Shai Haimson, Moshav, Beer Tuvia (IL); Gabe Schwartz, Tzahal 20/3, Kiryat Gat (IL); Michael Shifrin, Rambam 42/4, Ashqelon (IL)

( * ) Notice: Subject to any disclaimer, the term of this patent is extended or adjusted under 35 U.S.C. 154(b) by 0 days.

(21) Appl. No.: 12/345,568

(22) Filed: Dec. 29, 2008

(51) Int. Cl.
*H01L 21/302* (2006.01)
*H01L 21/461* (2006.01)

(52) U.S. Cl. ............... 438/725; 438/680; 438/604; 438/636; 257/E21.17; 257/E21.058; 257/E21.077; 257/E21.098; 257/E21.128; 257/E21.217; 257/E21.229; 257/E21.231; 257/E21.311; 257/E21.32; 257/E21.321

(58) Field of Classification Search ............ 438/9, 438/311, 199, 238, 381, 509, 604, 636, 680, 438/700, 706, 725, 752, 753, 922; 257/E21.17, 257/32, 58, 77, 98, 128, 217, 228, 231, 311, 257/321
See application file for complete search history.

(56) References Cited

U.S. PATENT DOCUMENTS

| | | | | |
|---|---|---|---|---|
| 6,461,984 B1 * | 10/2002 | Han et al. | ............ | 438/788 |
| 6,509,237 B2 * | 1/2003 | Wang et al. | ............ | 438/286 |
| 6,780,708 B1 * | 8/2004 | Kinoshita et al. | ............ | 438/241 |
| 6,835,662 B1 * | 12/2004 | Erhardt et al. | ............ | 438/689 |
| 6,869,542 B2 * | 3/2005 | Desphande et al. | ............ | 216/51 |
| 6,869,899 B2 * | 3/2005 | Mahorowala et al. | ............ | 438/950 |
| 6,893,938 B2 * | 5/2005 | Naeem et al. | ............ | 438/424 |
| 7,153,780 B2 * | 12/2006 | Hill et al. | ............ | 438/717 |

OTHER PUBLICATIONS

Smith, Steven R., et al., "Physical properties of PECVD Amorphous Carbon Deposited at High Temperature for Use as an Etch Hard Mask", 2006 Advanced Metalization Conference, Intel Corp., Santa Clara, CA, 2006, whole document.

Applied Materials, Inc., "Applied Producer APF (Advanced Patterning Film) PECVD," retrieved from http://www.appliedmaterials.com/products/producer_apf_4.html, on Dec. 29, 2008, 2 pgs.

* cited by examiner

*Primary Examiner*—David Nhu
(74) *Attorney, Agent, or Firm*—Blakely, Sokoloff, Taylor & Zafman LLP (57) ABSTRACT

Multi-layered carbon-based hardmask and method to form the same. The multi-layered carbon-based hardmask includes at least top and bottom carbon-based hardmask layers having different refractive indexes. The top and bottom carbon-based hardmask layer thicknesses and refractive indexes are tuned so that the top carbon-based hardmask layer serves as an anti-reflective coating (ARC) layer.

20 Claims, 7 Drawing Sheets

LITHOGRAPHIC PATTERNING FOR SUB-90NM WITH A MULTI-LAYERED CARBON-BASED HARDMASK

TECHNICAL FIELD

Embodiments of the invention are in the field of semiconductor devices, more specifically pertaining to carbon-based hardmasks for patterning of devices.

BACKGROUND

Semiconductor fabrication techniques may be used to form shallow trench isolation (STI) or damascene inter layer dielectric (ILD) features, for example, using 248 nanometer (nm) or 193 nm wavelength lithography technology. To enable patterning of a feature into a substrate layer, the layer is masked with a sacrificial mask stack including a carbon-based hardmask layer, a silicon-based anti-reflective coating (ARC) layer and a photo resist layer. To form the masking stack, the carbon-based hardmask layer is deposited using a plasma enhanced chemical vapor deposition (PECVD) process to form an amorphous carbon material. Then, a silicon-based material, such as silicon nitride ($Si_3N_4$) or silicon-oxy-nitride ($SiO_xN_y(H_z)$), is deposited, for example using another PECVD or CVD process to form the silicon-based ARC layer. The thickness and stoichiometry of the silicon-based ARC layer is tuned to provide the ARC with the desired anti-reflective properties.

248 nm and 193 nm generation resist formulations used for the photo resist layer limit the ability of the photo resist layer to withstand an etch process required to define the feature in the substrate. Because it is therefore undesirable to use resist as a mask to etch the substrate, after the photo resist layer is defined with a pattern by a photolithography operation, each of the silicon-based ARC layer and the carbon-based hardmask layer are defined with a dry etch process. With the thickness of the photo resist layer limited by etch resistance and patterning resolution, the carbon-based hardmask layer is utilized as a sacrificial layer to transfer a pattern into the substrate using a third dry etch process.

The sacrificial mask stack, however, incurs significant overhead to the fabrication of devices. As noted, to define a single feature layer, multiple sacrificial non-photo definable masking materials must be deposited, defined then removed by etch processes. While a silicon-based ARC layer is needed to avoid interference problems during lithography, deposition of such a layer entails expensive silane-based gases. Furthermore, stripping of a sacrificial hardmask including a similar material as the feature layer may compromise the feature layer and lead to failure. For example, if the substrate is of a material similar to that of the silicon-based ARC layer, then it must be ensured that patterning of either the carbon-based hardmask layer or the substrate removes all of the silicon-based ARC layer, otherwise a strip process capable of removing residual silicon-based ARC layer would also damage the substrate.

BRIEF DESCRIPTION OF THE DRAWINGS

Embodiments of the present invention are illustrated by way of example, and not limitation, in the figures of the accompanying drawings in which.

DETAILED DESCRIPTION

Embodiments of a multi-layered carbon-based hardmask are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Figure 1:
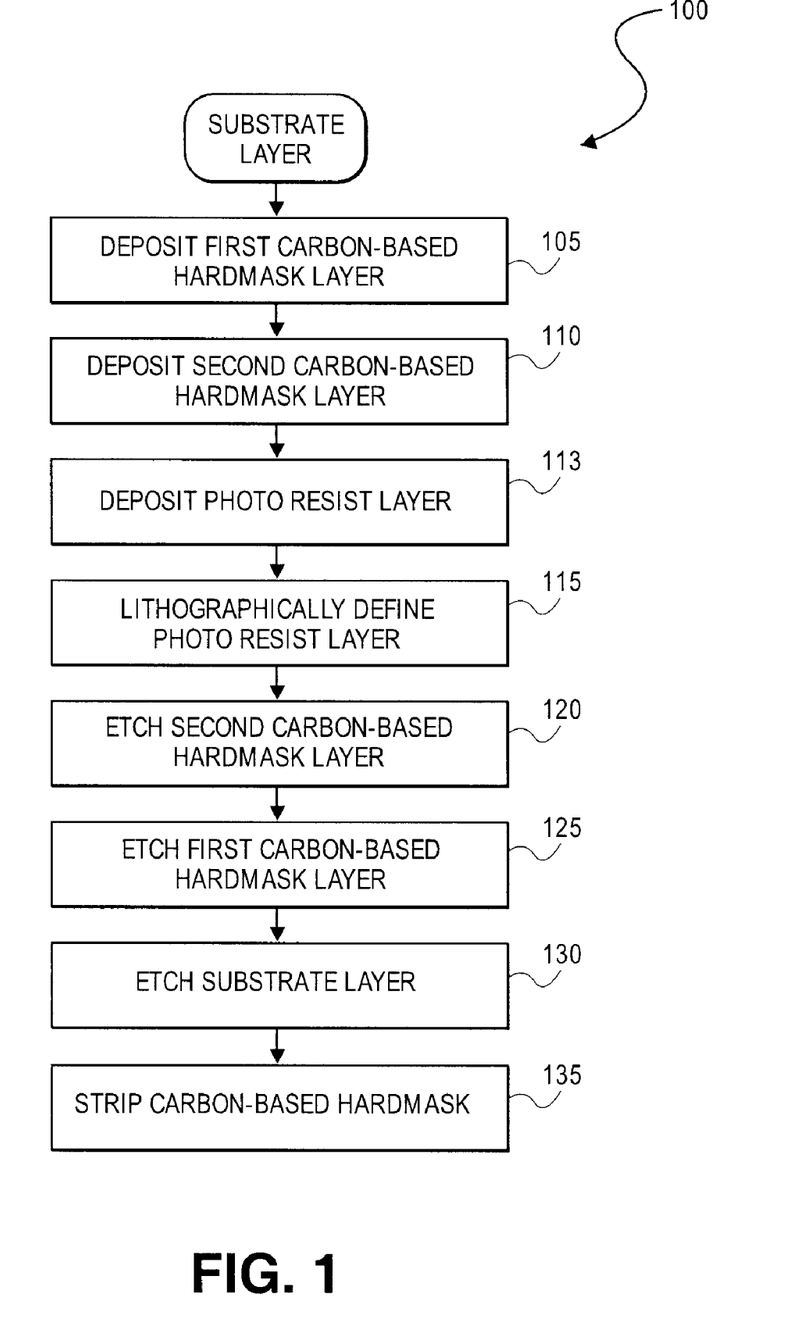
FIG. 1 illustrates a flow diagram of a method of forming a sacrificial hardmask, in accordance with an embodiment of the present invention.

FIG. 1 illustrates a flow diagram depicting sequences of particular operations employed in a fabrication method 100, in accordance with particular embodiments of the present invention. Generally, the fabrication method 100 exemplifies use of a multi-layered carbon-based hardmask for patterning a feature of a microelectronic device, such as a CMOS integrated circuit (IC) device, a memory device, a photo voltaic (PV) device, or the like.

Figure 2A:
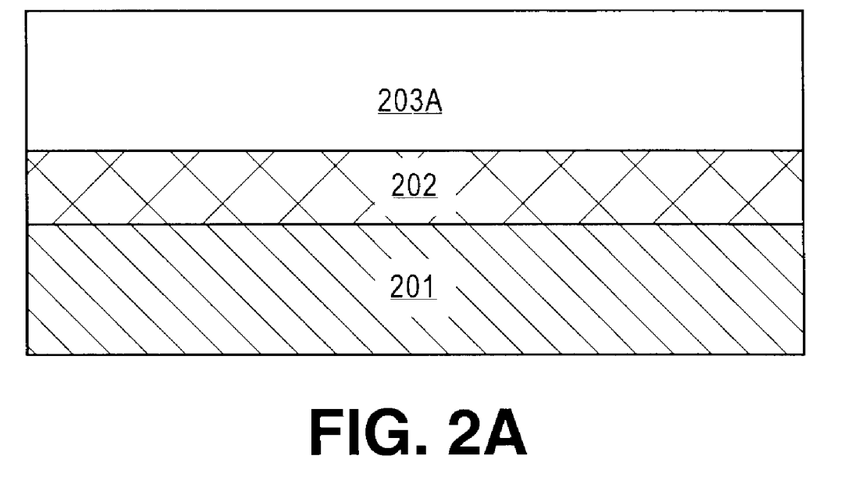
FIG. 2A illustrates a cross-sectional view representing particular operations in which a carbon-based bottom hardmask layer is formed, in accordance with an embodiment of the present invention.

As depicted, the fabrication method 100 begins with depositing a first carbon-based hardmask layer on a feature layer of a substrate at operation 105. FIG. 2A illustrates a cross-sectional view representing an exemplary intermediate device structure after performing operation 105. The substrate 201 may be a bulk substrate comprised of a single crystal of a material which may include, but is not limited to, silicon, germanium, silicon/germanium or a III-V compound semiconductor material. In another embodiment, the substrate 201 is comprised of a bulk layer with a top epitaxial layer. In a specific embodiment, the bulk layer is comprised of a single crystal of a material which may include, but is not limited to, silicon, germanium, silicon/germanium, a III-V compound semiconductor material and quartz, while the top epitaxial layer is comprised of a single crystal layer which may include, but is not limited to, silicon, germanium, silicon/germanium and a III-V compound semiconductor material. In another embodiment, the substrate is comprised of a top epitaxial layer on a middle insulator layer which is above a lower bulk layer. The top epitaxial layer is comprised of a single crystal layer which may include, but is not limited to, silicon (i.e. to form a silicon-on-insulator (SOI) semiconductor substrate), germanium, silicon/germanium and a III-V compound semiconductor material. The insulator layer is comprised of a material which may include, but is not limited to, silicon dioxide, silicon nitride and silicon oxy-nitride and hydrogenated silica (SiOH). The lower bulk layer is comprised of a single crystal which may include, but is not limited to, silicon, germanium, silicon/germanium, a III-V compound semiconductor material and quartz.

The exemplary embodiment depicted in FIG. 2A further includes a feature layer 202. Generally, the feature layer 202 may be any layer that is to be masked and patterned with a subsequent etching process as discussed in detail elsewhere herein. The feature layer 202 may comprise multiple dielectric, semiconductor, or conductor layers of various materials commonly known in the art. The feature layer 202 may be, for example, a shallow trench isolation (STI) region or a deep trench isolation region defining active areas in the substrate 201. In other embodiments, the feature layer 202 is a gate layer, an interlayer dielectric (ILD) layer or an interconnect layer, such as a tungsten interconnect layer.

FIG. 2A further depicts a first carbon-based hardmask layer 203A deposited on the feature layer 202. As used herein, the carbon-based hardmask layer 203A includes inorganic layers comprising at least 20 wt % carbon. Included in these materials is amorphous carbon, typically comprising greater than 50 wt % carbon. In another embodiment, the first carbon-based hardmask layer 203A is a low-k dielectric material comprising at least 20 wt % carbon content. Excluded from the "carbon-based" materials are materials having a total carbon content less than 20 wt %, such as those commonly employed as bottom anti-reflective coating (BARC) layers, which typically comprise polyamides and polysulfones and have less than 5 wt % carbon.

The first carbon-based hardmask layer 203A may be formed with a thermal deposition processes (CVD) or a plasma enhanced deposition processes (PECVD). In one embodiment, a PECVD process is employed at operation 105 to form a carbon material comprising at least 50 wt % Carbon with sp1, sp2 and sp3 bonding states giving the film properties which are a hybrid of those typical of pyrolylic, graphitic, and diamond-like carbon. Because the deposited carbon material may contain a plurality of bonding states in various proportions, it lacks long rang order and so is commonly referred to as "amorphous carbon."

In particular embodiments, the first carbon-based hardmask layer 203A is formed with a PECVD process using hydrocarbon precursors, such as methane ($CH_4$) along with an inert, such as helium (He) or argon (Ar). In a particular embodiment, the hydrocarbon precursor has a molecular formula of $C_xH_y$, where x>1, y>2 and x<y, such as, but not limited to, propylene ($C_3H_6$), propyne ($C_3H_4$), propane ($C_3H_8$), butane ($C_4H_{10}$), butylene ($C_4H_8$), butadiene ($C_4H_6$) and toluene ($C_7H_8(C_6H_5CH_3)$) and mixtures thereof. The carbon-based hardmask layer 203A may also include nitrogen or other additives. In an embodiment, the first carbon-based hardmask layer 203A is an amorphous carbon material referred to under the trade name Advanced Patterning Film™ (APF) which may be formed with equipment commercially available from Applied Materials, Inc., CA, U.S.A or ashable hard mask (AHM) by Novellus Systems Inc, also of CA. In an alternate embodiment at the lower end of the carbon wt % range, the first carbon-based hardmask layer 203A is a low-k dielectric, such as the material with the trade name of Black Diamond™ which may be formed with equipment also commercially available from Applied Materials, Inc.

In an embodiment, the first carbon-based hardmask layer 203A is formed with a PECVD process in a process chamber operated at a deposition temperature of approximately 500° C. or greater. In a further embodiment, the first carbon-based hardmask layer 203A is formed with a PECVD process at a deposition temperature between approximately 500° C. and 550° C. In still other embodiments, the first carbon-based hardmask layer 203A may be formed with a PECVD process at a deposition temperature greater than 550° C. It has been found that at such temperatures, a PECVD deposited amorphous carbon material has relatively high percentage of sp3 bonding for diamond-like carbon (DLC) material characteristics and have sufficiently low resistivity to be considered a conductive film. In one embodiment employing a PECVD process at a deposition temperature of approximately 550° C., the refractive index of the first carbon-based hardmask layer 203A is between approximately 2.04 and 2.08 and extinction coefficient of 0.40 to 0.42 at a wavelength of 248 nm.

In a further embodiment, the first carbon-based hardmask layer 203A is deposited to a thickness dependent on the material's resistance to the etch process used to subsequently pattern the feature layer 202 and the structural integrity of the carbon-based material (limiting the aspect ratio of the carbon-based hardmask layer). In one embodiment, the first carbon-based hardmask layer 203A is deposited to a thickness which is no greater than approximately 5 times the critical dimension of a feature to be subsequently etched into the feature layer 202, such that the carbon-based hardmask layer 203A has aspect ratio not significant greater than about 5:1. These aspect ratios will provide adequate structural integrity so that the first carbon-based hardmask layer 203A will not collapse during subsequent processing. In one such embodiment, the first carbon-based hardmask layer 203A is deposited to a thickness between approximately 100 nm and approximately 1000 nm. In a particular embodiment employing PECVD at approximately 550° C., the first carbon-based hardmask layer 203A is deposited to a thickness between approximately 400 nm to 600 nm.

Figure 2B:
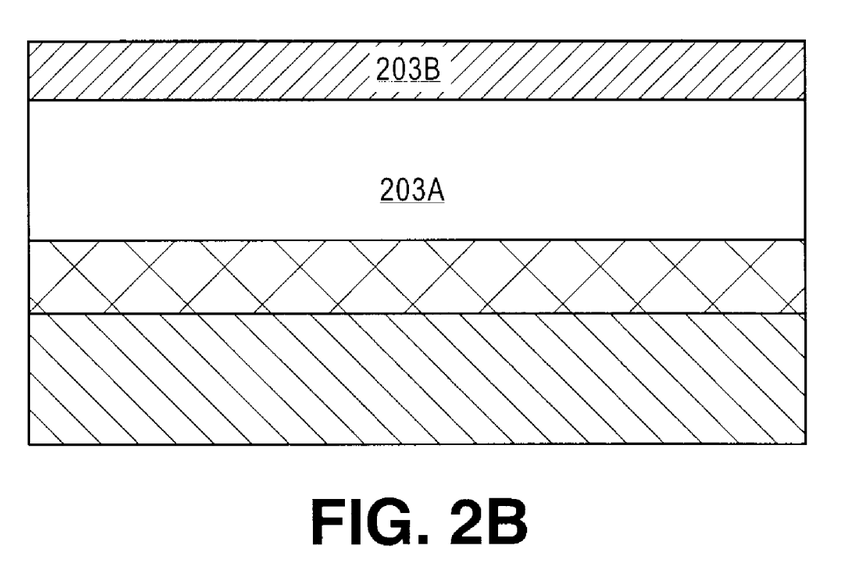
FIG. 2B illustrates a cross-sectional view representing particular operations in which a carbon-based top hardmask layer is formed over the carbon-based bottom hardmask layer depicted in FIG. 2A, in accordance with an embodiment of the present invention.

Returning to the exemplary method illustrated in FIG. 1, at operation 110, a second carbon-based hardmask layer is deposited over the first carbon-based hardmask to form a multi-layer carbon-based hardmask. FIG. 2B illustrates a cross-sectional view representing an exemplary intermediate device structure after performing operation 110. As depicted, a second carbon-based hardmask layer 203B is formed on the first carbon-based hardmask layer 203A to form a multi-layered carbon-based hardmask having both a bottom and a top carbon-based hardmask layer.

In an embodiment, the second carbon-based hardmask layer 203B is deposited in a manner to provide a refractive index and extinction coefficient tuned to achieve good performance as an ARC layer over the first carbon-based hardmask layer 203A. Any of the methods described elsewhere herein for forming the first carbon-based hardmask layer 203A may be utilized to form the second carbon-based hardmask layer 203B. In a particular embodiment, the second carbon-based hardmask layer 203B is formed in a PECVD chamber. In one such embodiment, the second carbon-based hardmask layer 203B is formed in a PECVD chamber distinct from the chamber used to deposit the first carbon-based hardmask layer 203A, but on the same cluster tool platform such that successive layers of a multi-layered carbon-based hardmask are formed without breaking vacuum.

In an embodiment, the second carbon-based hardmask layer 203B is deposited with a hydrocarbon precursor gas, such as any of those described for the first carbon-based hardmask layer 203A, with or without inert precursor gases. In a particular embodiment, the hydrocarbon precursor has a molecular formula of $C_xH_y$, where $x>1$, $y>2$ and $x<y$. In one such embodiment, the second carbon-based hardmask layer 203B is deposited with the same hydrocarbon precursor gas(es) used to form the first carbon-based hardmask layer 203A.

In an embodiment, the second carbon-based hardmask layer 203B is formed with a PECVD process at a deposition temperature that is lower than that employed to form the first carbon-based hardmask layer 203A. It has been found that good ARC performance can be achieved with a multi-layered carbon-based hardmask when the second carbon-based hardmask layer 203B is deposited at a process temperature that is at least 50° C. lower than that used to form the first carbon-based hardmask layer 203A. For applications where thermal budgets are constrained by other integration issues (e.g., dopant migration, metallization melting points, substrate outgassing, etc.), deposition temperatures for the second carbon-based hardmask layer 203B may be more than 50° C. lower than the deposition temperature of the first carbon-based hardmask layer 203A. In one exemplary embodiment where the first carbon-based hardmask layer 203A is deposited at a temperature between 500° C. and 550° C., the second carbon-based hardmask layer 203B is deposited at a temperature between approximately 400 and 500° C. In another exemplary embodiment, where the first carbon-based hardmask layer 203A is deposited at a temperature of 550° C., the second carbon-based hardmask layer 203B is deposited at a temperature of approximately 500° C.

Because the second carbon-based hardmask layer 203B is deposited at a reduced deposition temperature, the PECVD deposited amorphous carbon material has material characteristics that are more graphitic than the first carbon-based hardmask layer 203A. In one embodiment employing a PECVD process at a deposition temperature of approximately 500° C., the second carbon-based hardmask layer 203B has sufficiently high resistivity to be considered a dielectric film, have a refractive index between approximately 1.4 and 1.8, and have an extinction coefficient between 0.3 and 0.4 for a wavelength of 248 nm with dispersion of the refractive index and extinction coefficients further depicted in FIGS. 4A and 4B, respectively. It should be appreciated that this range of refractive index approximately matches those of conventional silicon-based ARC layers. In this manner, the first and second carbon-based hardmask layers may form a carbon-based multi-layered stack which does not suffer interface problems while avoiding the expensive gases needed for silicon-based ARC layers.

The thickness of the second carbon-based hardmask layer 203B may be tuned to provide minimal reflections and high contrast for a particular wavelength employed during photolithographic patterning of features. In exemplary embodiments, the second carbon-based hardmask layer 203B is formed to a thickness of between about 10 nm and 50 nm. It has been found that the second carbon-based hardmask layer 203B has good ARC characteristics when the thickness of the second carbon-based hardmask layer 203B is approximately one tenth that of the first carbon-based hardmask layer 203A. Thus, in one exemplary embodiment where a 10 nm thick second carbon-based hardmask layer 203B is utilized, the first carbon-based hardmask layer 203A is deposited to a thickness of approximately 100 nm. In such embodiments, the combination of reduced deposition temperature and reduced deposition thickness relative the first carbon-based hardmask layer 203A, render the second carbon-based hardmask layer 203B a good ARC layer enabling good results during a subsequent photolithography patterning process.

Figure 2C:
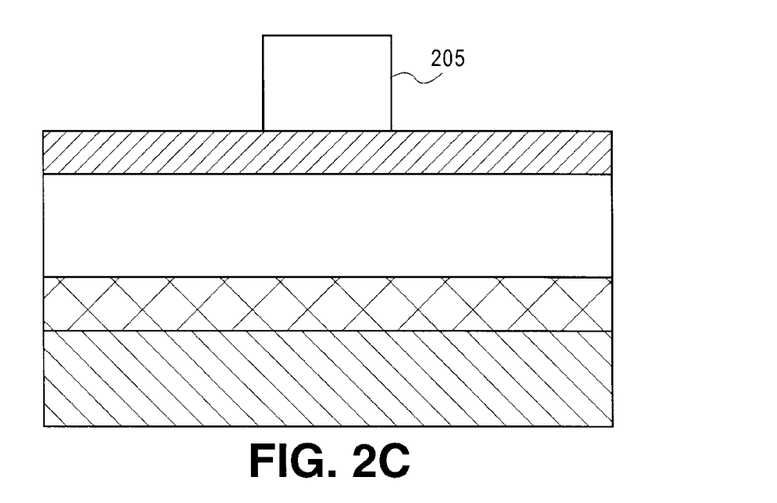
FIG. 2C illustrates a cross-sectional view representing particular operations in which a photo resist layer is patterned over the carbon-based top hardmask layer depicted in FIG. 2B, in accordance with an embodiment of the present invention.

Returning to FIG. 1, at operation 113, a photo resist layer is formed over a multi-layered carbon-based hardmask and lithographically defined into a patterned mask at operation 115. In the particular embodiment depicted in FIG. 2C, a patterned photo resist layer 205 is formed on the second carbon-based hardmask layer 203A. The patterned photo resist layer 205 may be patterned with any conventional means, such as with 193 nm or 248 nm photolithography utilizing suitable known resist compositions. Because the material properties of the second carbon-based hardmask layer 203B are in the range typical for silicon-based ARC layers, the multi-layered carbon-based hardmask provides good performance when coupled with lithography processes tuned for a silicon-based ARC. In the depicted embodiment, a bottom anti-reflective coating (BARC) is not employed. Use of a BARC layer may be unnecessary when the multi-layered carbon-based hardmask disclosed herein is utilized, thereby simplifying the photolithographic process. In a further embodiment the material properties of the second carbon-based hardmask layer 203B are such that adhesion promoters may also be avoided, allowing a photo resist to be applied directly to a multi-layered carbon-based hardmask.

Figure 2D:
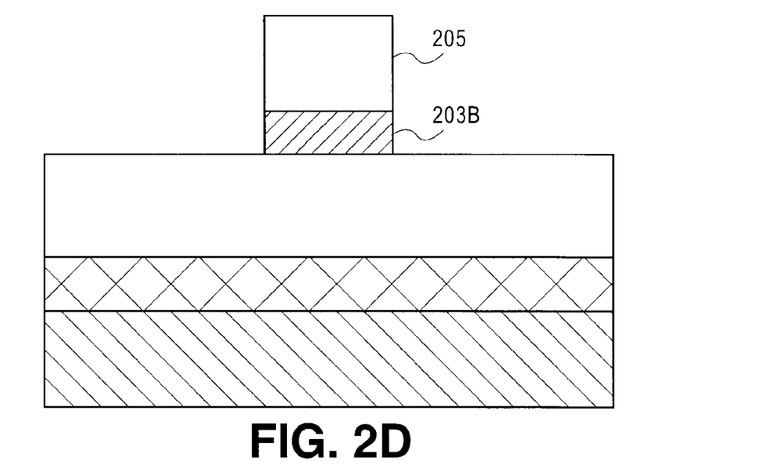
FIG. 2D illustrates a cross-sectional view representing particular operations in which a carbon-based top hardmask layer is patterned, in accordance with an embodiment of the present invention.

At operation 120 of FIG. 1, the second carbon-based hardmask layer 203B is etched into a feature, as further shown in FIG. 2D. Because the second carbon-based hardmask layer 203B served as an ARC during the lithography operation 115, etching of the hardmask is simplified relative to methods employing silicon-based ARC layers. For example, because there is no need for halogen etch chemistries (typically employed for silicon-based ARC layers) carryover of residual halogens into subsequent etch processes performed in an etch chamber is not a concern. Damage to amorphous carbon layers of a hardmask from halogen carryover may therefore be avoided. In one embodiment, the second carbon-based hardmask layer 203B is etched with a plasma etch process utilizing an oxygen-based chemistry ($O_2$, $CO_x$, etc.). In one such embodiment, the oxygen-based etch process utilized at operation 120 for etching the second carbon-based hardmask layer 203B generates relatively less oxygen ions than does a subsequent etch of the first carbon-based hardmask layer 203A. For example, a relatively lower power and a lower pressure etch process may be utilized at operation 120 to pattern the second carbon-based hardmask layer 203B with greater than 10:1 selectivity over the first carbon-based hardmask layer 203A. In a particular embodiment, an oxygen-based plasma etch is utilized to pattern the second carbon-based hardmask layer 203B with approximately 20:1 selectivity over the first carbon-based hardmask layer 203A.

Although the carbon-based hardmask layer 203B may be etched with an oxygen-based chemistry as described, conventional halogen-based etch chemistries may nonetheless also be used allowing for the multi-layered carbon-based hardmask methods disclosed herein to be seamlessly integrated into an existing hardmask etch process configured for hardmask stack utilizing a silicon-based ARC layer. For example, fluorine-based chemistries, such as $CF_4$, may be employed.

Figure 2E:
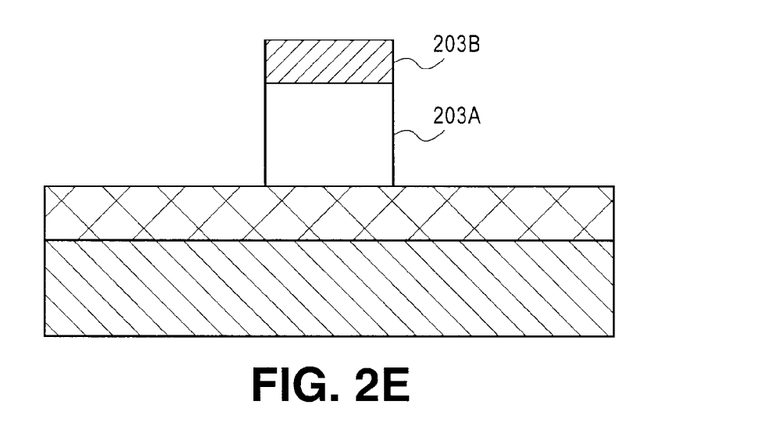
FIG. 2E illustrates a cross-sectional view representing particular operations in which a carbon-based bottom hardmask layer is patterned, in accordance with an embodiment of the present invention.

Returning to FIG. 1, at operation 125 the first carbon-based hardmask layer is then patterned with a second plasma etch process, as further shown in FIG. 2E. Unlike the second carbon-based hardmask layer 203B, the first carbon-based hardmask layer 203A should not be etched with halogen-based chemistries. In one embodiment, the first carbon-based hardmask layer 203A is etched with a plasma etch process utilizing an oxygen-based chemistry, such as ($O_2$, $CO_x$, etc.). In one such embodiment, the oxygen-based process utilized at operation 125 for etching the second carbon-based hardmask layer 203A generates relatively more oxygen ions than the etch of the first carbon-based hardmask layer 203A at operation 120. Because of the differing material characteristics of the first and second carbon-based hardmask layers in the multi-layered carbon-based hardmask, the first carbon-based hardmask layer 203A can be made to etch considerably faster than the second carbon-based hardmask layer 203B by increasing an oxygen ion concentration of the plasma. A relatively higher power and a higher pressure etch process may be utilized at operation 125 to pattern the first carbon-based hardmask layer 203A with at least 10:1 selectivity over the second carbon-based hardmask layer 203B. As shown in the embodiment depicted in FIG. 2E, etching of the first carbon-based hardmask layer 203A may completely remove the second carbon-based hardmask layer 203B. Some thickness of the second carbon-based hardmask layer 203B may however remain in alternative embodiments.

Figure 2F:
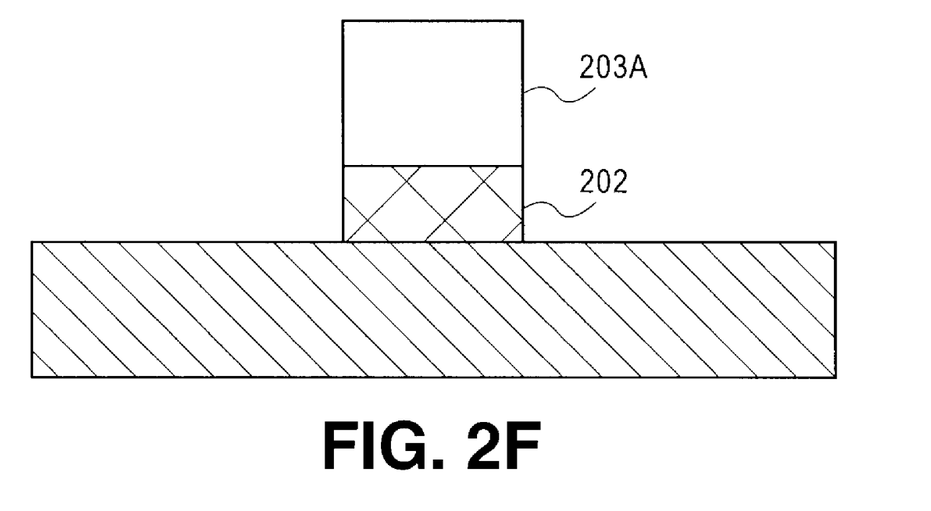
FIG. 2F illustrates a cross-sectional view representing particular operations in which a feature layer is patterned, in accordance with an embodiment of the present invention.
Figure 3A:
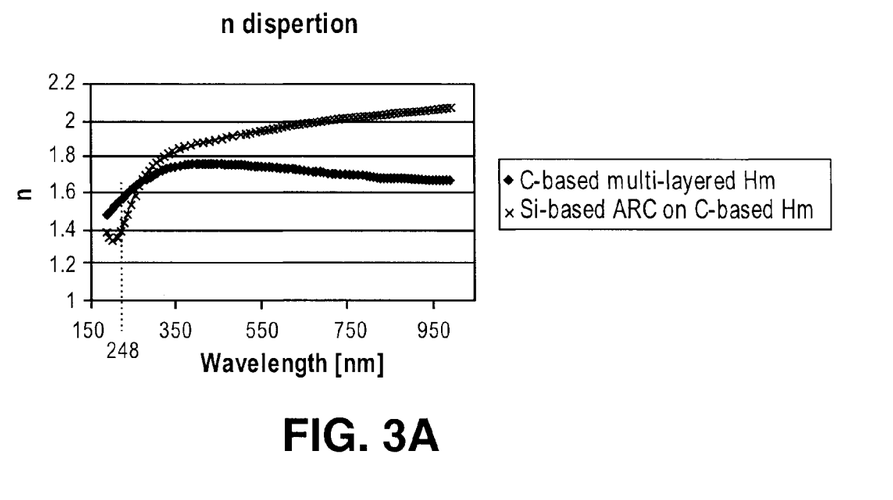
FIG. 3A illustrates a graph of refractive index dispersion of a carbon-based ARC layer, in accordance with an embodiment of the present invention.
Figure 3B:
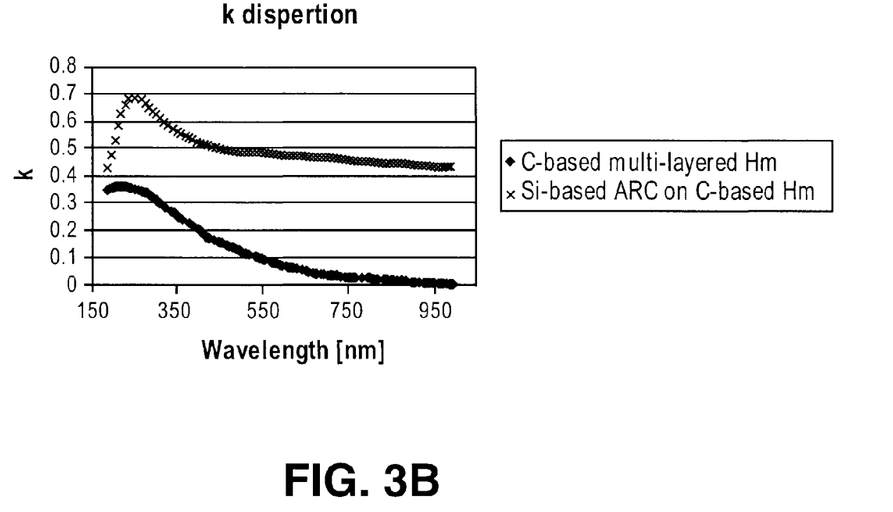
FIG. 3B illustrates a graph of extinction coefficient dispersion of a carbon-based ARC layer, in accordance with an embodiment of the present invention.

At operation 130, the substrate is then etched with the feature defined by the patterned carbon-based hardmask. For example, as depicted in FIG. 2F, the feature layer 202 is etched with any etch process known in the art applicable to the particular composition of the feature layer 202. Conventional halogen-based plasma chemistries may be utilized to etch semiconductor, insulator or conductor films to have the features defined by the first carbon-based hardmask layer 203A. Completing method 100, the all remaining layers of the multi-layered carbon-based hardmask are then stripped at operation 135. Conventional wet or dry oxidative processes may be employed at operation 135 to remove either or both the first carbon-based hardmask layer 203A and the second carbon-based hardmask layer 203B to render the patterned feature in feature layer 202 available for further processing.

Figure 4:
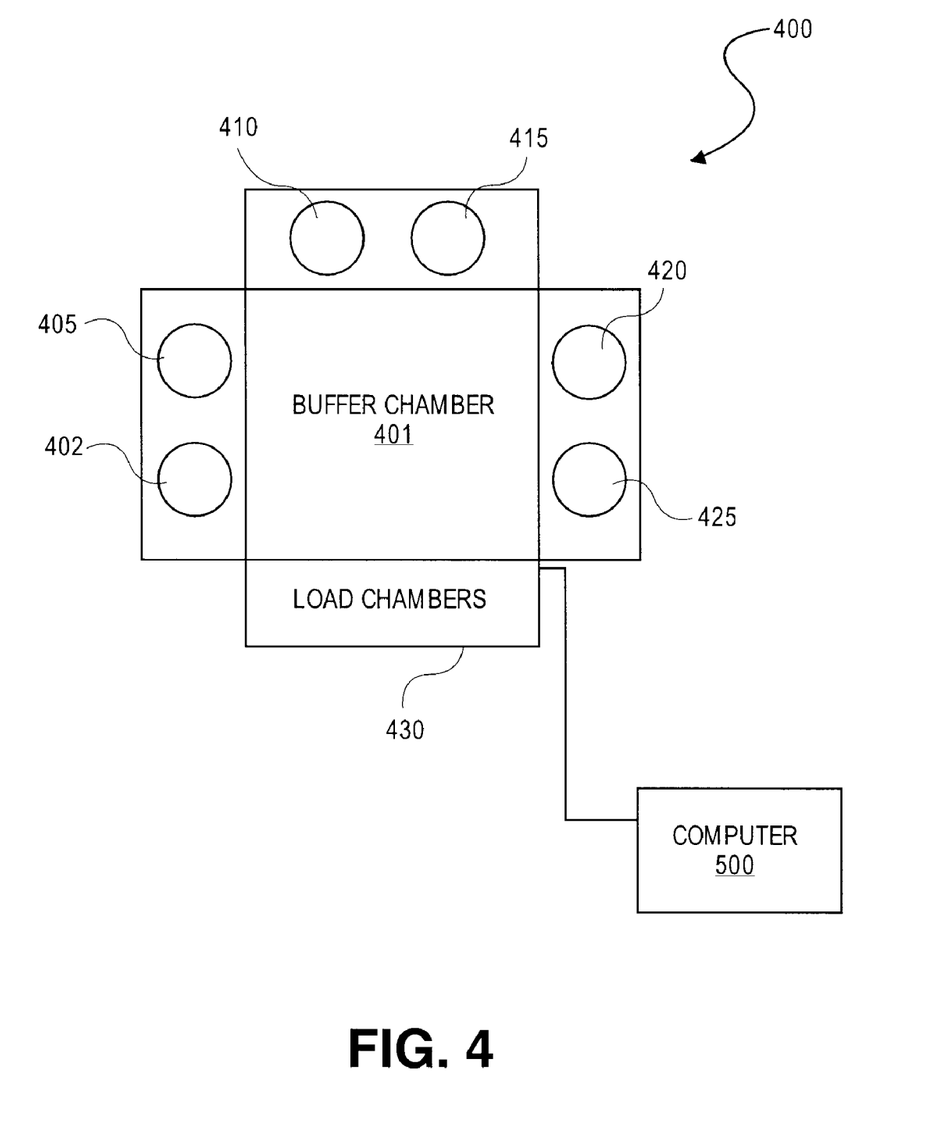
FIG. 4 illustrates a block diagram of a plan view of a multi-chambered deposition tool employed in the formation of a multi-layered carbon-based hardmask stack, in accordance with an embodiment of the present invention.

The multi-chambered processing platform 400 depicted in FIG. 4 may be utilized to form the multi-layered carbon-based hardmask described herein. Exemplary embodiments include a Centura™ system, commercially available from Applied Materials, Inc. of Santa Clara, Calif. The multi-chambered processing platform 400 includes a load chamber 430, coupled to an evacuated buffer chamber 401. Further coupled to the evacuated buffer chamber 401 are process chambers 402, 405, 410, 415, 420 and 425 for performing PECVD film deposition. Exemplary deposition chambers include DxZ™ and XT Producer™, also manufactured by and commercially available from Applied Materials of CA, USA. However, other deposition chambers can also be used for practicing embodiments of the present invention. In a particular embodiment, process chambers 402, 405, 410 and 415 may be configured to operate at a process temperature at least 50° C. higher than the temperature at which process chambers 420 and 425 are configured. The process chambers 402, 405, 410 and 415 may then be used to deposit a first carbon-based hardmask layer on a substrate using process gases and process durations applicable to form the film thicknesses and properties discussed elsewhere herein. The process chambers 420 and 425 may then be utilized in a process sequence to deposit on the first carbon-based hardmask layer a second carbon-based hardmask layer which has good ARC properties using process parameters as discussed elsewhere herein.

Figure 5:
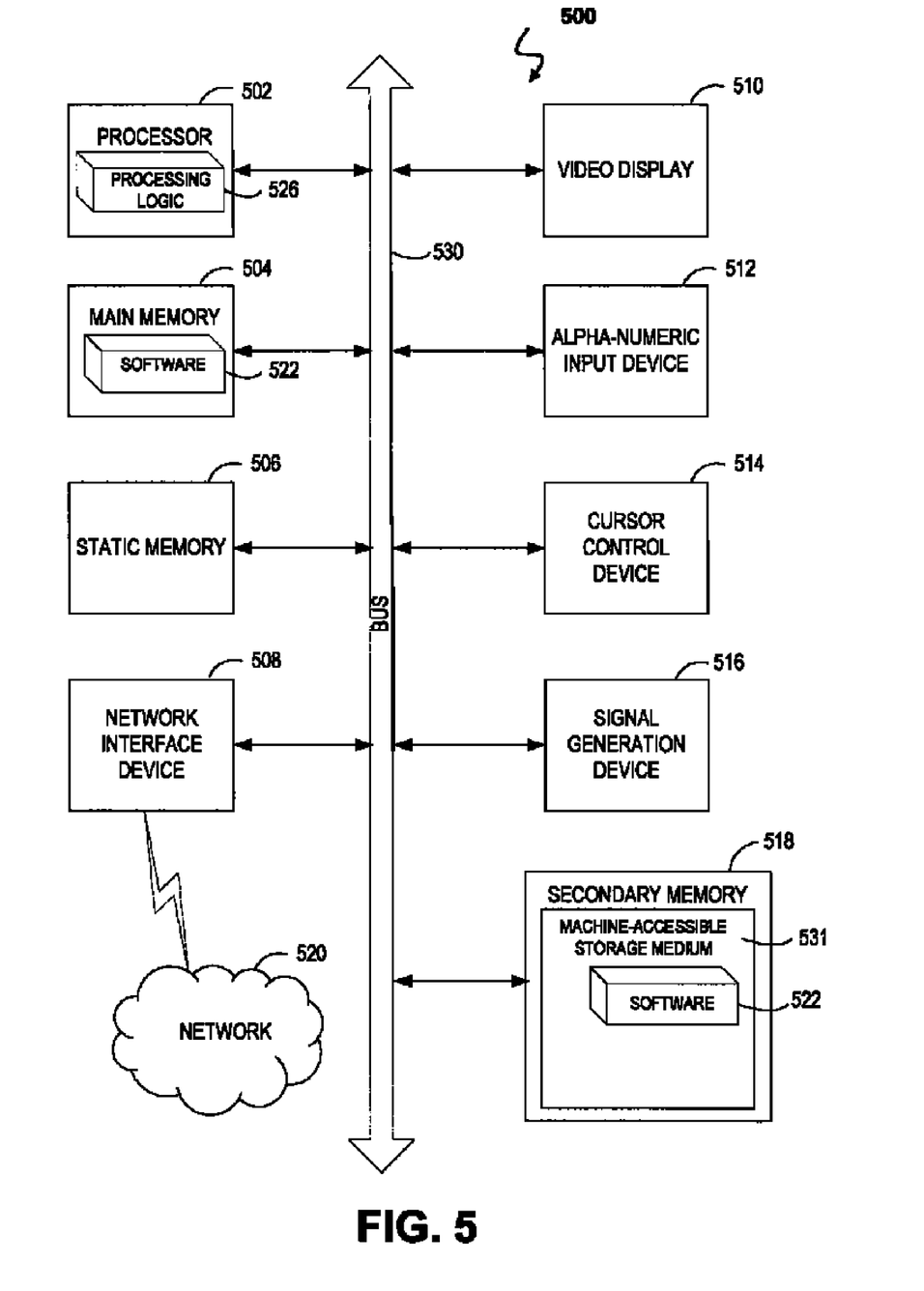
FIG. 5 illustrates a block diagram of an exemplary computer system, which may be used as a controller of the multi-chambered deposition tool depicted in FIG. 4, in accordance with one embodiment of the present invention.

In one exemplary embodiment, process recipe parameters and process sequences are performed on the multi-chambered processing platform 400 via a computer system 500. The computer system 500 may be one of any form of general-purpose data processing system that can be used in an industrial setting for controlling the various subprocessors and subcontrollers. Software commands, computer system 500, cause the multi-chambered processing platform 400 to, for example, retrieve a substrate from the load chamber 430 to the process chamber 402, 405, 410 or 415 and execute a first deposition process to form the first carbon-based hardmask layer 203A, load the substrate into the process chamber 420 or 425 and execute a second deposition process to form the second carbon-based hardmask layer 203B, and then return the substrate back to the load chamber 430.

FIG. 5 illustrates a diagrammatic representation of a machine in the exemplary form of the computer system 500 which may be utilized to control one or more of the operations, process chambers or processing platforms described herein, such as that depicted in FIG. 4. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a web appliance, a server, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

The processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. The processor 502 may also be one or more special-purpose processing devices such as an application specific integrated circuit (ASIC), a field programmable gate array (FPGA), a digital signal processor (DSP), network processor, or the like. The processor 502 is configured to execute the processing logic 526 for performing the process operations discussed elsewhere herein.

The computer system 500 may further include a network interface device 508. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a computer-readable storage medium) 531 on which is stored one or more sets of instructions (e.g., software 522) embodying any one or more of the methods or functions described herein. The software 522 may also reside, completely or at least partially, within the main memory 504 and/or within the processor 502 during execution thereof by the computer system 500, the main memory 504 and the processor 502 also constituting machine-readable storage media. The software 522 may further be transmitted or received over a network 520 via the network interface device 508.

The machine-readable storage medium 531 may further be used to store a set of instructions for execution by a processing system and that cause the system to perform any one or more of the embodiments of the present invention. Embodiments of the present invention may further be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, and flash memory devices, etc.).

Thus, patterning of a device structure with a multi-layered carbon-based hardmask and a method to form the same has been disclosed. Although the present invention has been described in language specific to structural features or methodological acts, it is to be understood that the invention defined in the appended claims is not necessarily limited to the specific features or acts described. The specific features and acts disclosed are to be understood as particularly graceful implementations of the claimed invention in an effort to illustrate rather than limit the present invention.

What is claimed is:

1. A method of fabricating a microelectronic device structure, comprising:
    forming a multi-layered carbon-based hardmask on a substrate layer; wherein the multi-layered carbon-based hardmask includes a first carbon-based hardmask layer having a first refractive index and a second carbon-based hardmask layer having a second refractive index;
    patterning a photo resist layer disposed over the multi-layered carbon-based hardmask; and
    etching a pattern into the multi-layered carbon-based hardmask.

2. The method of fabricating a microelectronic device structure as in claim 1, wherein the first carbon-based hardmask layer is an amorphous carbon layer with a refractive index at 248 nm of at least 2.0 while the second carbon-based hardmask layer is an amorphous carbon layer with a refractive index at 248 nm of less than 2.0.

3. The method of fabricating a microelectronic device structure as in claim 2, wherein the first carbon-based hardmask layer has a refractive index between 2.04 and 2.08 and wherein the second carbon-based hardmask layer has a refractive index between 1.4 and 1.8.

4. The method of fabricating a microelectronic device structure as in claim 1, wherein the first carbon-based hardmask layer is deposited to a thickness greater than that of the second carbon-based hardmask layer.

5. The method of fabricating a microelectronic device structure as in claim 4, wherein the first carbon-based hardmask layer is deposited to a thickness between 8 and 12 times that of the second carbon-based hardmask layer.

6. The method of fabricating a microelectronic device structure as in claim 5, wherein the second carbon-based hardmask layer has a thickness between 10 nm and 50 nm.

7. A method of fabricating a microelectronic device structure, comprising:
    depositing a first carbon-based hardmask layer over a substrate feature layer to be etched;
    depositing a second carbon-based hardmask layer on the first carbon-based hardmask layer to form a multi-layered carbon-based hardmask;
    forming a patterned photo resist layer over the multi-layered carbon-based hardmask;
    etching the multi-layered carbon-based hardmask; and
    etching the substrate feature layer.

8. The method of fabricating a microelectronic device structure as in claim 7, wherein the first and second carbon-based hardmask layers are deposited in PECVD chambers using the same precursor gas ratios.

9. The method of fabricating a microelectronic device structure as in claim 7, wherein the first carbon-based hardmask layer is a bottom amorphous carbon hardmask layer deposited on the substrate feature layer and wherein the second carbon-based hardmask layer is a top amorphous carbon layer deposited on the bottom amorphous carbon hardmask layer.

10. The method of fabricating a microelectronic device structure as in claim 9, wherein the bottom amorphous carbon hardmask layer is deposited in a first PECVD chamber and the top amorphous hardmask layer is deposited in a second PECVD chamber.

11. The method of fabricating a microelectronic device structure as in claim 10, wherein the bottom amorphous carbon hardmask layer is deposited at a temperature at least 50° C. higher than that used for depositing the top amorphous carbon hardmask layer.

12. The method of fabricating a microelectronic device structure as in claim 11, wherein the bottom amorphous carbon hardmask layer is deposited at a temperature of approximately 550° C. and the top amorphous carbon hardmask layer is deposited at a temperature between 400° C. and 500° C.

13. The method of fabricating a microelectronic device structure as in claim 10, wherein the first and second PECVD chambers are components of a same sub-atmospheric cluster tool.

14. The method of fabricating a microelectronic device structure as in claim 10, wherein the bottom amorphous carbon hardmask layer is deposited to a greater thickness than the top amorphous carbon hardmask layer.

15. The method of fabricating a microelectronic device structure as in claim 14, wherein the bottom amorphous carbon hardmask layer is deposited to a thickness approximately ten times that of the top amorphous carbon hardmask layer.

16. The method of fabricating a microelectronic device structure as in claim 9, wherein etching the multi-layered carbon hardmask further comprises:
   etching the top amorphous carbon hardmask layer with a first plasma process providing a greater than 10:1 etch selectivity over the bottom amorphous carbon hardmask layer, the first plasma process being either oxygen-based and having a first oxygen ion species concentration or being halogen-based;
   etching the bottom amorphous carbon hardmask layer with a second plasma process providing a selectivity greater than 5:1 over the top carbon-based hardmask layer, the second plasma process being oxygen-based and having a second oxygen ion species concentration, higher than the first oxygen ion species concentration.

17. The method of fabricating a microelectronic device structure as in claim 16, wherein the second plasma process is performed at a higher process pressure and RF power than the first plasma process.

18. The method of fabricating a microelectronic device structure as in claim 8, wherein forming the patterned photo resist layer further comprises:
   depositing a photo resist; and
   exposing the photo resist with radiation having a wavelength no greater than 248 nm to define a pattern in the photo resist.

19. A computer readable media having instructions stored thereon which when executed by a computer processing system cause the system to perform a method comprising:
   depositing a bottom carbon-based hardmask layer over a substrate feature layer to be etched;
   depositing a top carbon-based hardmask layer on the bottom carbon-based hardmask layer to form a multi-layered carbon-based hardmask;
   forming a patterned photo resist layer over the multi-layered carbon-based hardmask;
   etching the multi-layered carbon-based hardmask; and
   etching the substrate feature layer.

20. The method of fabricating a microelectronic device structure as in claim 1, wherein each of the first and second carbon-based hardmask layers is an amorphous carbon layer.

* * * * *